United States Patent
Lee et al.

(10) Patent No.: US 12,015,014 B2
(45) Date of Patent: Jun. 18, 2024

(54) SEMICONDUCTOR PACKAGE

(71) Applicant: SAMSUNG ELECTRONICS CO., LTD., Suwon-si (KR)

(72) Inventors: Doohwan Lee, Cheonan-si (KR); Jungsoo Byun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/679,861

(22) Filed: Feb. 24, 2022

(65) Prior Publication Data
US 2022/0181303 A1    Jun. 9, 2022

Related U.S. Application Data

(63) Continuation of application No. 16/940,045, filed on Jul. 27, 2020, now Pat. No. 11,289,456.

(30) Foreign Application Priority Data

Dec. 13, 2019  (KR) .................. 10-2019-0166308

(51) Int. Cl.
*H01L 25/065* (2023.01)
*H01L 23/00* (2006.01)
(Continued)

(52) U.S. Cl.
CPC ........ *H01L 25/0657* (2013.01); *H01L 23/041* (2013.01); *H01L 23/3128* (2013.01);
(Continued)

(58) Field of Classification Search
CPC ... H01L 25/0657; H01L 25/041; H01L 25/16; H01L 25/043; H01L 25/0652;
(Continued)

(56) References Cited

U.S. PATENT DOCUMENTS 6,952,049 B1    10/2005   Ogawa et al.
7,294,922 B2    11/2007   Jobetto et al.
(Continued)

FOREIGN PATENT DOCUMENTS

KR    10-2019-0030972    3/2019
KR    10-2019-0096562    8/2019

OTHER PUBLICATIONS

Notice of Allowance dated Dec. 22, 2021 in Corresponding U.S. Appl. No. 16/940,045.
(Continued)

*Primary Examiner* — Victor A Mandala
*Assistant Examiner* — Lawrence C Tynes, Jr.
(74) *Attorney, Agent, or Firm* — F. Chau & Associates, LLC

(57) ABSTRACT

A semiconductor package includes a frame having a through-opening, a first semiconductor chip disposed in the through-opening and having a first active surface on which a first connection pad is disposed and a first inactive surface opposing the first active surface, a second semiconductor chip disposed on the first semiconductor chip and having a second active surface on which a second connection pad is disposed and a second inactive surface opposing the second active surface, first and second bumps electrically connected to the first and second connection pads, respectively, first and second dummy bumps disposed on a same level as levels of the first and second bumps, respectively, first and second posts electrically connected to the first and second bumps, respectively, a connection member including a redistribution layer electrically connected to each of the first and second posts, and a dummy post disposed between the frame and the connection member.

17 Claims, 12 Drawing Sheets

(51) Int. Cl.
*H01L 23/04* (2006.01)
*H01L 23/31* (2006.01)
*H01L 23/538* (2006.01)

(52) U.S. Cl.
CPC .......... *H01L 23/5383* (2013.01); *H01L 24/16* (2013.01); *H01L 24/17* (2013.01); *H01L 24/32* (2013.01); *H01L 24/73* (2013.01); *H01L 2224/0401* (2013.01); *H01L 2224/16227* (2013.01); *H01L 2224/1703* (2013.01); *H01L 2224/32145* (2013.01); *H01L 2224/73203* (2013.01); *H01L 2225/06562* (2013.01)

(58) Field of Classification Search
CPC .... H01L 25/071; H01L 25/112; H01L 25/117; H01L 25/074; H01L 25/0756; H01L 23/5383; H01L 23/3128; H01L 23/49816; H01L 23/49541–59565; H01L 23/49838–49844; H01L 23/49575; H01L 23/49822; H01L 23/4985; H01L 23/49861; H01L 23/5226; H01L 23/49827; H01L 23/5384; H01L 2224/32145; H01L 2224/0401; H01L 2224/16227; H01L 2224/1703; H01L 2224/73203; H01L 2224/73253; H01L 2224/04105; H01L 2224/12105; H01L 2224/16135–16148; H01L 2224/16245–1626; H01L 2224/8085–8089; H01L 2224/8185–8189; H01L 2224/05009; H01L 2224/05025; H01L 2224/05087; H01L 2224/0509; H01L 2224/0557; H01L 2224/08146; H01L 2224/13009; H01L 2224/13025; H01L 2224/16146; H01L 2224/29009; H01L 2224/29025; H01L 2924/19105; H01L 2924/15331; H01L 2924/171–17798; H01L 24/97; H01L 24/16; H01L 24/17; H01L 24/06; H01L 2225/1058; H01L 2225/06503–06596; H01L 2225/06541–06544; H01L 2225/06548; H01L 2225/16165; H01L 2225/16235; H01L 2225/32165; H01L 2225/32235; H01L 2225/40165; H01L 2225/40235; H01L 2225/48165; H01L 21/76802–76817; H01L 21/76877–76883
See application file for complete search history.

(56) References Cited

U.S. PATENT DOCUMENTS

| | | | |
|---|---|---|---|
| 7,825,520 B1 | 11/2010 | Longo et al. | |
| 8,654,538 B2 | 2/2014 | Kariya et al. | |
| 9,177,906 B1* | 11/2015 | Jeon | H01L 24/17 |
| 9,324,626 B2 | 4/2016 | Shen et al. | |
| 9,711,482 B2 | 7/2017 | Lee et al. | |
| 9,716,080 B1 | 7/2017 | Chuang et al. | |
| 9,793,246 B1 | 10/2017 | Tseng et al. | |
| 9,966,360 B2 | 5/2018 | Yu et al. | |
| 10,128,213 B2 | 11/2018 | Yu et al. | |
| 10,157,851 B2 | 12/2018 | Kim et al. | |
| 10,347,606 B2 | 7/2019 | Yu et al. | |
| 10,861,826 B2 | 12/2020 | Oh et al. | |
| 2001/0036711 A1* | 11/2001 | Urushima | H01L 21/563 438/460 |
| 2010/0171208 A1 | 7/2010 | Fuji | |
| 2010/0193930 A1 | 8/2010 | Lee | |
| 2010/0314740 A1 | 12/2010 | Choi et al. | |
| 2010/0327419 A1* | 12/2010 | Muthukumar | H01L 25/50 257/686 |
| 2011/0079890 A1 | 4/2011 | Song et al. | |
| 2011/0278717 A1* | 11/2011 | Pagaila | H01L 23/5389 257/737 |
| 2012/0007227 A1 | 1/2012 | Cho et al. | |
| 2013/0082399 A1 | 4/2013 | Kim et al. | |
| 2013/0127054 A1 | 5/2013 | Muthukumar et al. | |
| 2013/0147038 A1* | 6/2013 | Ishikawa | H01L 25/0657 257/737 |
| 2013/0147063 A1 | 6/2013 | Park et al. | |
| 2013/0277837 A1 | 10/2013 | Teh et al. | |
| 2015/0102506 A1 | 4/2015 | Song et al. | |
| 2015/0187742 A1* | 7/2015 | Kwon | H01L 21/568 257/774 |
| 2015/0373849 A1* | 12/2015 | Huang | H05K 1/0373 361/767 |
| 2016/0013173 A1* | 1/2016 | Vadhavkar | H01L 21/563 438/109 |
| 2017/0278821 A1* | 9/2017 | Zhao | H01L 24/20 |
| 2017/0373040 A1* | 12/2017 | Pagani | G01R 31/2884 |
| 2017/0373041 A1 | 12/2017 | Kim et al. | |
| 2018/0277520 A1 | 9/2018 | Yu et al. | |
| 2018/0337065 A1* | 11/2018 | Lin | H01L 23/3128 |
| 2019/0057940 A1 | 2/2019 | Cheah et al. | |
| 2019/0088566 A1 | 3/2019 | Ha et al. | |
| 2019/0221543 A1 | 7/2019 | Sung | |
| 2019/0229093 A1 | 7/2019 | Dominquez et al. | |
| 2019/0252311 A1 | 8/2019 | Kuroyanagi et al. | |
| 2019/0287924 A1 | 9/2019 | Moon et al. | |
| 2020/0006194 A1 | 1/2020 | Huang et al. | |
| 2020/0006293 A1* | 1/2020 | Sankman | H01L 23/13 |
| 2020/0020635 A1 | 1/2020 | Chang et al. | |
| 2020/0020643 A1* | 1/2020 | Yu | H01L 23/49827 |
| 2020/0075551 A1* | 3/2020 | Oh | H01L 24/17 |
| 2020/0273799 A1 | 8/2020 | Sung et al. | |
| 2020/0273800 A1 | 8/2020 | Kim et al. | |
| 2021/0118847 A1 | 4/2021 | Chuang et al. | |
| 2021/0183817 A1 | 6/2021 | Lee et al. | |
| 2021/0217700 A1 | 7/2021 | Choi | |

OTHER PUBLICATIONS

Office Action dated Oct. 5, 2021 in Corresponding U.S. Appl. No. 16/940,045.

KR Office Action dated Aug. 1, 2023 In Corresponding KR Application No. 10-2019-0166308.

* cited by examiner

SEMICONDUCTOR PACKAGE

CROSS-REFERENCE TO RELATED APPLICATION(S)

This application is a continuation of U.S. patent application Ser. No. 16/940,045 filed Jul. 27, 2020, which claims priority under 35 U.S.C. § 119 to Korean Patent Application No. 10-2019-0166308, filed on Dec. 13, 2019 in the Korean Intellectual Property Office, the disclosures of which are incorporated by reference herein in their entirety.

TECHNICAL FIELD

Exemplary embodiments of the present inventive concept relate to a semiconductor package.

DISCUSSION OF THE RELATED ART

As the demand for electronic products having high capacity and reduced thicknesses and sizes increases, various forms of semiconductor packages have been developed. Among various types of semiconductor package techniques, a package technique of configuring a single package to include a plurality of semiconductor chips has been developed.

SUMMARY

An exemplary embodiment of the present inventive concept is to provide a semiconductor package which may implement wirings at high density on a substrate using a low-cost process.

According to an exemplary embodiment of the present inventive concept, a semiconductor package includes a frame having a through-opening, a plurality of semiconductor chips including a first semiconductor chip disposed in the through-opening and having a first active surface on which a first connection pad is disposed and a first inactive surface opposing the first active surface, and a second semiconductor chip disposed on the first semiconductor chip and having a second active surface on which a second connection pad is disposed and a second inactive surface opposing the second active surface. The semiconductor package further includes first and second bumps electrically connected to the first and second connection pads, respectively, first and second dummy bumps disposed on a same level as levels of the first and second bumps, respectively, first and second posts electrically connected to the first and second bumps, respectively, a connection member including a redistribution layer electrically connected to each of the first and second posts, and a dummy post disposed between the at least one frame and the connection member.

According to an exemplary embodiment of the present inventive concept, a semiconductor package includes a frame having a through-opening, a first semiconductor chip disposed in the through-opening of the frame, and having a first active surface on which a first connection pad is disposed and a first inactive surface opposing the first active surface, first bump patterns including a first bump connected to the first connection pad on the first active surface of the first semiconductor chip and at least one first dummy bump which is not connected to the connection pad, and a first filling layer filling a region between the frame and the first semiconductor chip, covering the first inactive surface of the first semiconductor chip and a lower surface of the frame, and covering a portion of the first active surface of the first semiconductor chip.

According to an exemplary embodiment of the present inventive concept, a semiconductor package includes a frame having a through-opening, a plurality of semiconductor chips, a plurality of filling layers surrounding side surfaces of the plurality of semiconductor chips, respectively, a connection member disposed on the plurality of filling layers, a plurality of posts disposed in the plurality of filling layers, and a plurality of bumps electrically connected to the plurality of semiconductor chips, respectively. The plurality of semiconductor chips includes a first semiconductor chip disposed in the through-opening and a second semiconductor chip partially overlapping the first semiconductor chip and the frame. The plurality of filling layers includes a first filling layer surrounding a side surface of the first semiconductor chip in the through-opening, and a second filling layer surrounding a side surface of the second semiconductor chip. The plurality of bumps includes a first bump electrically connected to a first connection pad of the first semiconductor chip, and a second bump electrically connected to a second connection pad of the second semiconductor chip. The plurality of posts includes a first post penetrating the second filling layer on the first filling layer and electrically connected to the first bump, and a plurality of dummy posts penetrating the second filling layer on the frame.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
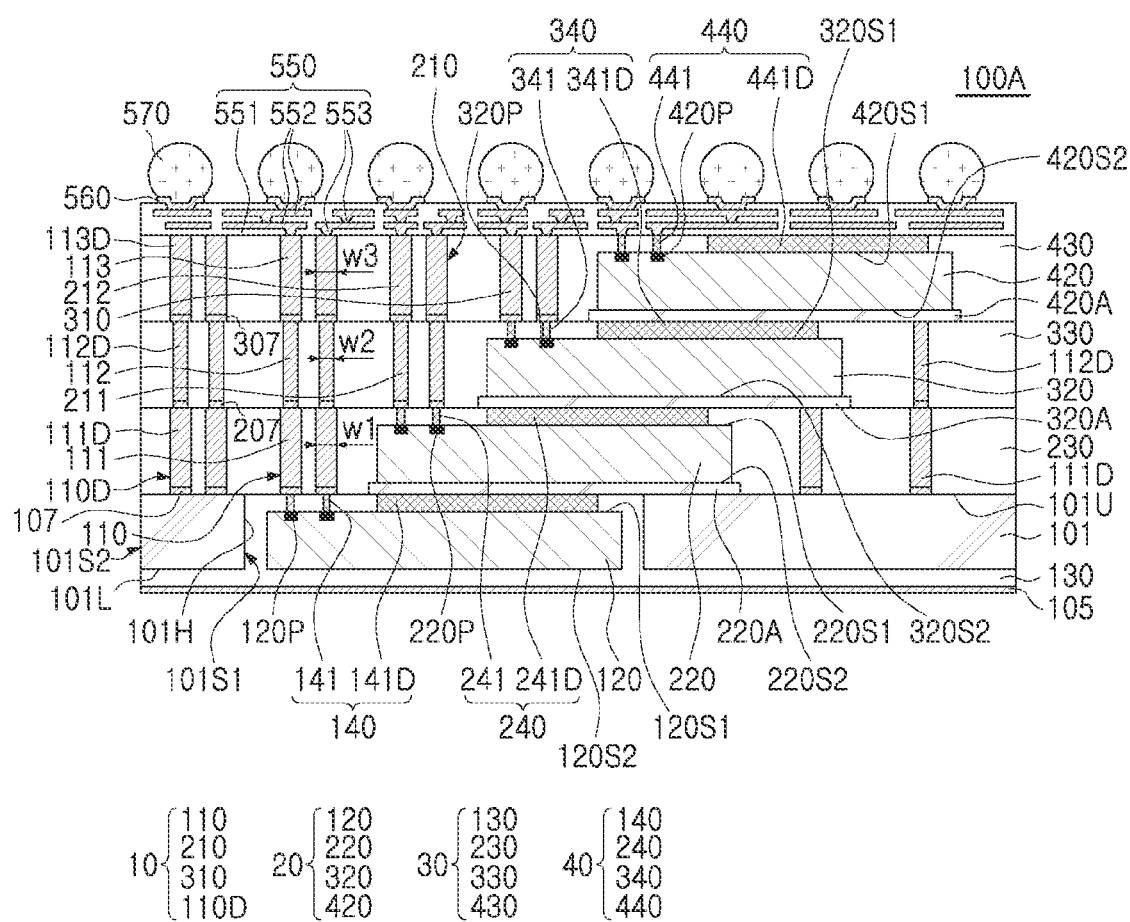
FIG. 1 is a cross-sectional diagram illustrating a semiconductor package according to an exemplary embodiment of the present inventive concept.

Exemplary embodiments of the present inventive concept will be described more fully hereinafter with reference to the accompanying drawings. Like reference numerals may refer to like elements throughout the accompanying drawings.

FIG. 1 is a cross-sectional diagram illustrating a semiconductor package according to an exemplary embodiment.

Referring to FIG. 1, a semiconductor package 100A may include a frame 101, a plurality of semiconductor chips 20 including a first semiconductor chip 120, a plurality of bump patterns 40, a plurality of posts 10, and a connection member 550 including a redistribution layer 552.

The frame 101 may have an upper surface 101U and a lower surface 101L. The upper surface 101U may face the connection member 550.

The frame 101 may have a through-opening 101H. The first semiconductor chip 120 may be disposed in the through-opening 101H. In an exemplary embodiment, a passive component, such as, for example, an inductor or a capacitor, may be disposed in the through-opening 101H.

The frame 101 may have a first side surface 101S1 and a second side surface 101S2. The first side surface 101S1 may be exposed by the through-opening 101H and may face the first semiconductor chip 120. The second side surface 101S2 may oppose the first side surface 101S1. The second side surface 101S2 may form a portion of an external side surface of the semiconductor package 100A.

The frame 101 may include an insulating material. The insulating material may include at least one of, for example, a thermosetting resin such as an epoxy resin, and a thermoplastic resin such as a polyimide resin. The insulating material may include an insulating material in which the thermosetting resin or the thermoplastic resin is impregnated in a core material such as an inorganic filler and/or a glass fiber (or a glass cloth or a glass fabric), such as, for example, prepreg, an Ajinomoto build-up film (ABF), FR-4, bismaleimide triazine (BT), etc.

In an exemplary embodiment, the frame 101 may include a plurality of insulating layers, a plurality of wiring layers buried in the insulating layers, and a plurality of wiring via layers electrically connecting the plurality of wiring layers to one another.

The frame 101 may work as a support member providing a planar surface on which the plurality of semiconductor chips 20 may be stacked. The frame 101 may improve stiffness of the semiconductor package 100A, and may maintain flatness of the semiconductor package 100A.

The plurality of semiconductor chips 20 may further include a second semiconductor chip 220 disposed on the first semiconductor chip 120, a third semiconductor chip 320 disposed on the second semiconductor chip 220, and a fourth semiconductor chip 420 disposed on the third semiconductor chip 320, in addition to the first semiconductor chip 120.

The plurality of semiconductor chips 20 may have a structure in which the first to fourth semiconductor chips 120, 220, 320, and 420 are stacked. However, exemplary embodiments are not limited thereto. For example, in an exemplary embodiment, the plurality of semiconductor chips 20 may have a structure in which less than four or more than four semiconductor chips are stacked.

Each of the first to fourth semiconductor chips 120, 220, 320, and 420 may include an integrated circuit (IC). Each of the first to fourth semiconductor chips 120, 220, 320, and 420 may have an active surface on which the integrated circuit is disposed and an inactive surface opposing the active surface. Connection pads, which may apply an electrical signal to each of the first to fourth semiconductor chips 120, 220, 320, and 420, may be disposed on the active surface. For example, the first semiconductor chip 120 may have a first active surface 120S1 on which a first connection pad 120P is disposed, and a first inactive surface 120S2 opposing the first active surface 120S1. Similarly, the second to fourth semiconductor chips 220, 320, and 420 may include second to fourth active surfaces 220S1, 320S1, and 420S1 on which second to fourth connection pads 220P, 320P, and 420P are disposed, respectively, and second to fourth inactive surfaces 220S2, 320S2, and 420S2 opposing the second to fourth active surfaces 220S1, 320S1, and 420S1, respectively.

The first semiconductor chip 120 may be disposed in the through-opening 101H such that the first active surface 120S1 may face the connection member 550. The second semiconductor chip 220 may be disposed such that the first active surface 120S1 may face the connection member 550 on the upper surface 101U of the frame 101. The third semiconductor chip 320 may be disposed such that the third active surface 320S1 may face the connection member 550 on the upper surface 101U. The fourth semiconductor chip 420 may be disposed such that the fourth active surface 420S1 may face the connection member 550 on the upper surface 101U.

The first to fourth semiconductor chips 120, 220, 320, and 420 may be sequentially offset such that the first to fourth connection pads 120P, 220P, 320P, and 420P may be exposed. For example, the first to fourth semiconductor chips 120, 220, 320, and 420 may be sequentially offset and stacked towards one corner of the connection member 550.

In an exemplary embodiment, portions of the first to fourth semiconductor chips 120, 220, 320, and 420 may overlap one another vertically. For example, at least a portion of the second semiconductor chip 220 may be disposed on the first semiconductor chip 120 such that the at least a portion of the second semiconductor chip 220 may overlap at least a portion of the first semiconductor chip 120. The second semiconductor chip 220 may partially overlap the first semiconductor chip 120 and the frame 101.

In the semiconductor package 100A, the first semiconductor chip 120 may be disposed in the through-opening 101H of the frame 101, and the second to fourth semiconductor chips 220, 320, and 420 may be stacked on the upper surface 101U of the frame 101. However, exemplary embodiments are not limited thereto. For example, in an exemplary embodiment, another frame may further be disposed on the frame 101, and the second semiconductor chip 220 may be disposed in a through-opening of another frame. This configuration may also be applied to the third semiconductor chip 320 and the fourth semiconductor chip 420. By providing the frame, a semiconductor package having improved flatness may be provided.

Each of the first to fourth semiconductor chips 120, 220, 320, and 420 may be implemented as a memory chip. The memory chip may include, for example, a DRAM, an SRAM, a flash memory, a PRAM, a ReRAM, a FeRAM, or an MRAM.

In an exemplary embodiment, the first to fourth semiconductor chips 120, 220, 320, and 420 may be the same type of semiconductor chips or different types of semiconductor chips.

In an exemplary embodiment, the first to fourth semiconductor chips 120, 220, 320, and 420 may be included in a high bandwidth memory (HBM).

The plurality of bump patterns 40 may include first bump patterns 140 disposed on the first active surface 120S1 of the first semiconductor chip 120, second bump patterns 240 disposed on the second active surface 220S1 of the second semiconductor chip 220, third bump patterns 340 disposed on the third active surface 320S1 of the third semiconductor chip 320, and fourth bump patterns 440 disposed on the fourth active surface 420S1 of the fourth semiconductor chip 420.

The first bump patterns 140 may include a first bump 141 disposed on the first connection pad 120P and a first dummy bump 141D disposed on a level the same as a level of the first bump 141. For example, the first bump 141 and the first dummy bump 141D may be substantially aligned with each other in a cross-sectional view. In an exemplary embodiment, the first bump 141 is electrically connected to the first connection pad 120P, and the first dummy bump 141D is not electrically connected to the first connection pad 120P.

Herein, the term "dummy" may refer to elements manufactured with other elements that are used to implement an electrical connection, but that do not themselves implement an electrical connection. For example, according to exemplary embodiments, a dummy bump may be manufactured together with a bump, and while the bump may be electrically connected to another element, the dummy bump is not electrically connected to another element. Similarly, according to exemplary embodiments, a dummy post may be manufactured together with a post, and while the post may be electrically connected to another element, the dummy post is not electrically connected to another element.

The second bump patterns 240 may include a second bump 241 disposed on the second connection pad 220P and a second dummy bump 241D disposed on a same level as a level of the second bump 241. For example, the second bump 241 and the second dummy bump 241D may be substantially aligned with each other in a cross-sectional view. In an exemplary embodiment, the second bump 241 is electrically connected to the second connection pad 220P, and the second dummy bump 241D is not electrically connected to the second connection pad 220P.

The third bump patterns 340 may include a third bump 341 disposed on the third connection pad 330P and a third dummy bump 341D disposed on a same level as a level of the third bump 341. In an exemplary embodiment, the third bump 341 is electrically connected to the third connection pad 320P, and the third dummy bump 341D is not electrically connected to the third connection pad 320P.

The fourth bump patterns 440 may include a fourth bump 441 disposed on the fourth connection pad 430P and a fourth dummy bump 441D disposed on a same level as a level of the fourth bump 441. In an exemplary embodiment, the fourth bump 441 is electrically connected to the fourth connection pad 420P, and the fourth dummy bump 441D is not electrically connected to the fourth connection pad 420P.

In an exemplary embodiment, each of the first to fourth bumps 141, 241, 341, and 441 may have a pillar shape.

In an exemplary embodiment, each of the first to fourth bumps 141, 241, 341, and 441 may have a width similar to or substantially the same as a width of each of the first to fourth connection pads 120P, 220P, 320P, and 420P, respectively. For example, the first connection pad 120P may have a width in a range of about 40 μm to about 60 μm, and the first bump 141 may have a similar width.

In an exemplary embodiment, the number of the first bump 141, a gap between the first bumps 141, and a dispositional form of the first bump 141 may be the same as the number of the first connection pad 120P, a gap between the first connection pads 120P, and a dispositional form of the first connection pad 120P, respectively. The first bump 141 may aligned with the first connection pad 120P.

In an exemplary embodiment, the number of the second bump 241, a gap between the second bumps 241, and a dispositional form of the second bump 241 may be the same as the number of the second connection pad 220P, a gap between the second connection pads 220P, and a dispositional form of the second connection pad 220P, respectively. The second bump 241 may aligned with the second connection pad 220P.

In an exemplary embodiment, the number of the third bump 341, a gap between the third bumps 341, and a dispositional form of the third bump 341 may be the same as the number of the third connection pad 320P, a gap between the third connection pads 320P, and a dispositional form of the third connection pad 320P, respectively. The third bump 341 may aligned with the third connection pad 320P.

In an exemplary embodiment, the number of the fourth bump 441, a gap between the fourth bumps 441, and a dispositional form of the fourth bump 441 may be the same as the number of the fourth connection pad 420P, a gap between the fourth connection pads 420P, and a dispositional form of the fourth connection pad 420P, respectively. The fourth bump 441 may aligned with the fourth connection pad 420P.

In an exemplary embodiment, each of the first to fourth dummy bumps 141D, 241D, 341D, and 441D may have a plate shape. The first to fourth dummy bumps 141D, 241D, 341D, and 441D may have heights the same as heights of the first to fourth bumps 141, 241, 341, and 441, respectively.

In an exemplary embodiment, each of the first to fourth bump patterns 140, 240, 340, and 440 may have a height greater than about 0 μm and equal to or less than about 40 μm.

In an exemplary embodiment, each of the first to fourth bump patterns 140, 240, 340, and 440 may have a height greater than about 0 μm and equal to or less than about 30 μm. Thus, in an exemplary embodiment, each of the first bump 141 and the second bump 241 may have a height greater than about 0 μm and equal to or less than about 30 μm.

In an exemplary embodiment, the first to fourth bump patterns 140, 240, 340, and 440 may include a metal such as copper (Cu). The first to fourth bump patterns 140, 240, 340, and 440 may be formed of the same material.

The first to fourth dummy bumps 141D, 241D, 341D, and 441D may improve warpage of the semiconductor package 100A, and may maintain flatness of the semiconductor package 100A. The first to fourth dummy bumps 141D, 241D, 341D, and 441D may emit heat generated from the plurality of semiconductor chips 20.

The plurality of posts 10 may include a first post 110 disposed on the first connection pad 120P, a second post 210 disposed on the second connection pad 220P, a third post 310 disposed on the third connection pad 320P, and a dummy post 110D disposed on the frame 101.

The first post 110 may be disposed on the first bump 141. The first post 110 may vertically overlap the first bump 141. For example, the first post 110 may overlap the first bump 141 in a cross-sectional view. The first post 110 may extend in a direction substantially perpendicular to the first active surface 120S1 of the first semiconductor chip 120. The first post 110 may be electrically connected to the first connection pad 120P. A width of a lower portion of the first post 110 may be greater than a width of the first bump 141.

The first post 110 may include a first lower post 111, a first intermediate post 112, and a first upper post 113, stacked sequentially. The first lower post 111, the first intermediate post 112, and the first upper post 113 may vertically overlap one another. The first lower post 111, the first intermediate post 112, and the first upper post 113 may have different widths. The first intermediate post 112 may be disposed on the first lower post 111, and the first upper post 113 may be disposed on the first intermediate post 112.

The first lower post 111 may have a first width w1 greater than a width of the first bump 141. The first intermediate post 112 may have a second width w2 less than the width w1. The first upper post 113 may have a third width w3 greater than the second width w2. Thus, the first post 110 may be understood as having a plurality of regions having different widths. Accordingly, an alignment margin of the first lower post 111, the first intermediate post 112, and the first upper post 113 may improve.

In an exemplary embodiment, a cross-sectional shape of each of the first lower post 111, the first intermediate post 112, and the first upper post 113 may be varied. For example, each of the first lower post 111, the first intermediate post 112, and the first upper post 113 may have a circular shape or an oval shape.

In an exemplary embodiment, each of the first lower post 111, the first intermediate post 112, and the first upper post 113 may have a tapered shape or a cylindrical shape.

The second post 210 may be disposed on the first bump 141. The second post 210 may vertically overlap the second bump 241. The second post 210 may extend in a direction substantially perpendicular to the second active surface 220S1 of the second semiconductor chip 220. The second post 210 may be electrically connected to the second connection pad 220P. A width of a lower portion of the second post 210 may be greater than a width of the second bump 241.

The second post 210 may include a second lower post 211 and a second upper post 212 vertically overlapping each other and having different widths. The second upper post 212 may be disposed on the second lower post 211.

The second lower post 211 may have a second width w2 greater than a width of the second bump 241 and substantially the same as a width of the first intermediate post 112. The second upper post 212 may have the third width w3 greater than the second width w2 and substantially the same as a width of the first upper post 113. The second post 210 may be understood as having a plurality of regions having different widths. In this case, an alignment margin of the second lower post 211 and the second upper post 212 may improve.

In an exemplary embodiment, a shape of a cross-sectional surface of each of the second lower post 211 and the second upper post 212 may be varied. For example, the cross-sectional surface may have a circular or an oval shape.

In an exemplary embodiment, each of the second lower post 211 and the second upper post 212 may have a tapered shape or a cylindrical shape.

The third post 310 may be disposed on the third bump 341. The third post 310 may vertically overlap the third bump 341. The third post 310 may extend in a direction substantially perpendicular to the third active surface 320S1 of the third semiconductor chip 320. The third post 310 may be electrically connected to the third connection pad 320P. A width of a lower portion of the third post 310 may be greater than a width of the third bump 341.

The third post 310 may have the third width w3 greater than a width of the third bump and substantially the same as a width of the first upper post 113 or the second upper post 212.

In an exemplary embodiment, a distance between an upper end and a lower end of the first post 110 may be greater than a distance between an upper end and a lower end of the second post 210.

In an exemplary embodiment, a distance between an upper end and a lower end of the second post 210 may be greater than a distance between an upper end and a lower end of the third post 310.

In an exemplary embodiment, a shape of a cross-sectional surface of the third post 310 may be varied. For example, the cross-sectional surface may have a circular shape or an oval shape.

In an exemplary embodiment, the third post 310 may have a tapered shape or a cylindrical shape.

In an exemplary embodiment, the plurality of posts 10 may have a structure in which the first to third posts 110, 210, and 310 are disposed. However, exemplary embodiments are not limited thereto. For example, the number of the plurality of posts 10, a gap between the plurality of posts 10, and a dispositional form of the plurality of posts 10 may be varied in accordance with the number of semiconductor chips included in the plurality of semiconductor chips 20 and/or the number of the exposed connection pads.

In an exemplary embodiment, the first to third posts 110, 210, and 310 may include a metal material including copper. Each of the first to third posts 110, 210, and 310 may have a pillar shape.

The first to third posts 110, 210, and 310 may form an electrical path between the first to third semiconductor chips 120, 220, and 320 and the redistribution layer 552 of the connection member 550 through the first to third connection pads 120P, 220P, and 320P, respectively. The connection member 550 for redistribution may have relatively high wiring density without increasing a thickness of the semiconductor package such that a size of the semiconductor package may be reduced. Since a post is used for an electrical path of the redistribution layer 552, instead of using wiring bonding using gold (Au), process costs may be reduced, and a reduced connection distance may be implemented such that an operation speed of the semiconductor chip may improve. According to exemplary embodiments, by forming the plurality of posts using an electrolytic plating and by forming the redistribution layer for redistributing the posts, a packaging technique which may reduce manufacturing cost and may implement a plurality of input and output (I/O) paths may be provided.

The dummy post 110D may be disposed on the upper surface 101U of the frame 101, and may overlap the frame 101. The dummy post 110D may be disposed between the frame 101 and the connection member 550. The dummy post 110D may extend in a direction substantially perpendicular to the first active surface 120S1 of the first semiconductor chip 120. The dummy post 110D may be electrically insulated with the plurality of semiconductor chips 20. The dummy post 110D may be electrically insulated with a signal pattern of the redistribution layer 552. In an exemplary embodiment, the dummy post 110D is not electrically connected to the connection member 550.

The dummy post 110D may include a first dummy post 111D, a second dummy post 112D, and a third dummy post 113D vertically overlapping one another and having different widths. The third dummy post 113D may be disposed on the second dummy post 112D, and the second dummy post 112D may be disposed on the first dummy post 111D.

The first dummy post 111D may have the first width w1 substantially the same as a width of the first lower post 111. The second dummy post 112D may have the second width w2 substantially the same as a width of the first intermediate post 112. The third dummy post 113D may have the third width w3 substantially the same as a width of the first upper post 113. Thus, the dummy post 110D may be understood as having a plurality of regions having different widths.

In an exemplary embodiment, a shape of a cross-sectional surface of each of the first dummy post 111D, the second dummy post 112D, and the third dummy post 113D may be varied. For example, the cross-sectional surface may have a circular shape or an oval shape.

In an exemplary embodiment, each of the first dummy post 111D, the second dummy post 112D, and the third dummy post 113D may have a tapered shape or a cylindrical shape.

In an exemplary embodiment, at least one of the dummy posts 110D may have a height and/or a thickness substantially the same as that of the first post 110.

In an exemplary embodiment, at least a portion of the dummy post 110D may be disposed between the frame 101 and the third semiconductor chip 320 or between the frame 101 and the fourth semiconductor chip 420.

In an exemplary embodiment, at least one of the dummy posts 110D may overlap at least one of the plurality of semiconductor chips 20. For example, the first dummy post 111D may be disposed between the frame 101 and the third semiconductor chip 320, and may overlap the third semiconductor chip 320. As illustrated in FIG. 1, the first dummy post 111D and the second dummy post 112D may be disposed between the frame 101 and the fourth semiconductor chip 420 and may overlap the fourth semiconductor chip 420.

In an exemplary embodiment, the dummy post 110D may include a metal material including copper. The dummy post 110D may have a pillar shape.

In an exemplary embodiment, the number of the dummy post 110D, a gap between the dummy posts 110D, and a dispositional form of the dummy post 110D may be varied. For example, a greater number of the dummy posts 110D may be disposed between the frame 101 and the connection member 550. The number of the stacked semiconductor chips may increase or decrease in accordance with the number of the dummy posts 110D.

Since the dummy post 110D is disposed on the frame 101, the semiconductor package 100A may include a greater number of metal layers such that warpage of the semiconductor package 100A may be reduced.

The dummy post 110D may improve heat dissipation properties of the semiconductor package 100A. For example, since the dummy post 110D is disposed between the frame 101 and the connection member 550, heat generated from the plurality of semiconductor chips 20 may be efficiently emitted.

In an exemplary embodiment, the dummy post 110D may have a height substantially the same as that of the first post 110. A distance between an upper end and a lower end of the dummy post 110D may be substantially the same as a distance between an upper end and a lower end of the first post 110.

In an exemplary embodiment, upper surfaces of the first to third posts 110, 210, and 310 may be substantially coplanar with an upper surface of the dummy post 110D. For example, upper surfaces of the first to third posts 110, 210, and 310 may be substantially aligned with the upper surface of the dummy post 110D.

In an exemplary embodiment, the first lower post 111 may have an upper surface substantially coplanar with an upper surface of the first dummy post 111D. For example, the upper surface of the first lower post 111 may be substantially aligned with the upper surface of the first dummy post 110D.

In an exemplary embodiment, upper surfaces of the first intermediate post 112, the second lower post 211, and the second dummy post 112D may be substantially coplanar with one another. For example, upper surfaces of the first intermediate post 112, the second lower post 211, and the second dummy post 112D may be substantially aligned with one another.

In an exemplary embodiment, upper surfaces of the first upper post 113, the second upper post 212, the third post 310, and the third dummy post 113D may be substantially coplanar with one another. For example, upper surfaces of the first upper post 113, the second upper post 212, the third post 310, and the third dummy post 113D may be substantially aligned with one another.

In an exemplary embodiment, the first to third posts 110, 210, and 310 and the first to third dummy posts 111D, 112D, and 113D may include first to third metal seed layers 107, 207, and 307 disposed below the first to third posts 110, 210, and 310 and the first to third dummy posts 111D, 112D, and 113D, respectively. For example, the first post 110 may include the first metal seed layer 107 disposed below the first post 110 and connected to the first connection pad 120P. The first metal seed layer 107 may be disposed below the first dummy post 111D may also be disposed on the frame 101. The first to third metal seed layers 107, 207, and 307 may be formed by an electroless plating method. In an exemplary embodiment, the first to third metal seed layers 107, 207, and 307 are not provided.

An insulating layer 551 burying the redistribution layer 552 and a redistribution via 553 penetrating the insulating layer 551 and connected to the redistribution layer 552 may be further included in addition to the redistribution layer 552 of the connection member 550.

The connection member 550 may redistribute the first to fourth connection pads 120P, 220P, 320P, and 420P of the first to fourth semiconductor chips 120, 220, 320, and 420. The first to fourth connection pads 120P, 220P, 320P, and 420P may be physically and/or electrically connected to an external entity through the connection member 550.

The insulating layer 551 may include an insulating material described above. The insulating material may include a photosensitive insulating material such as PID resin.

In an exemplary embodiment, when the insulating layer 551 includes a photosensitive insulating material, a thickness of the insulating layer 551 may be reduced and a fine pitch of the redistribution via 553 may be efficiently implemented.

The redistribution layer 552 may redistribute the first to fourth connection pads 120P, 220P, 320P, and 420P. The redistribution layer 552 may include a metal material such as, for example, copper (Cu), aluminum (Al), silver (Ag), tin (Sn), gold (Au), nickel (Ni), lead (Pb), titanium (Ti), or alloys thereof. The redistribution layer 552 may perform various functions depending on a design of each of the respective layers. For example, the redistribution layer 552 may include a ground pattern, a power pattern, a signal pattern, etc. The signal pattern may include various signals other than a ground pattern, a power pattern, etc., such as, for example, a data signal. The pattern may include a wiring and a pad.

The redistribution via 553 may electrically connect the redistribution layer 552 and the first to fourth connection pads 120P, 220P, 320P, and 420P to one another such that an electrical path may be formed in the connection member 550. The redistribution via 553 may include a metal material such as, for example, copper (Cu), aluminum (Al), silver (Ag), tin (Sn), gold (Au), nickel (Ni), lead (Pb), titanium (Ti), or alloys thereof. The redistribution via 553 may be a filled type via completely filled with a metal material, or may be a conformal type via in which a metal material is formed along a wall of a via hole. The redistribution via 553 may have a cross-sectional surface having a tapered shape. For example, the redistribution via 553 may have a tapered shape in which a width of an upper portion thereof may be greater than a width of a lower portion.

The number of each of the insulating layer 551, the redistribution layer 552, and the redistribution via 553 of the connection member 550 may be greater than or less than the examples illustrated in the figures.

Referring to FIG. 1, the semiconductor package 100A may further include a plurality of filling layers 30.

The plurality of filling layers 30 may include a first filling layer 130, a second filling layer 230, a third filling layer 330, and a fourth filling layer 430. The second filling layer 230 may be disposed on the first filling layer 130, the third filling layer 330 may be disposed on the second filling layer 230, and the fourth filling layer 430 may be disposed on the third filling layer 330.

In an exemplary embodiment, the connection member 550 may be disposed on the plurality of filling layers 30. The plurality of posts 10 may be disposed in the plurality of filling layers 30.

The first filling layer 130 may be disposed in the through-opening 101H of the frame 101, and may cover the first active surface 120S1 and the first inactive surface 120S2 of the first semiconductor chip 120. In an exemplary embodiment, the first filling layer 130 may cover an entirety of the first inactive surface 120S2 of the first semiconductor chip 120, and may partially cover the first active surface 120S1 of the first semiconductor chip 120. The first filling layer 130 may surround a side surface of the first semiconductor chip 120. The first filling layer 130 may cover side surfaces of the first bump patterns 140. The first filling layer 130 may extend to cover the first inactive surface 120S2 of the first semiconductor chip 120 and to cover the lower surface 101L of the frame 101. The first filling layer 130 may fill a region between the frame 101 and the first semiconductor chip 120, may extend to and cover the first inactive surface 120S2 of the first semiconductor chip 120 and the lower surface 101L of the frame 101, and may also extend to and cover a portion of the first active surface 120S1 of the first semiconductor chip 120.

The second filling layer 230 may be disposed on the first active surface 120S1 of the first semiconductor chip 120, and may cover the second active surface 220S1 of the second semiconductor chip 220. The second filling layer 230 may surround a side surface of the second semiconductor chip 220. The second filling layer 230 may cover side surfaces of the second bump patterns 240. The second filling layer 230 may cover a side surface of the first lower post 111 and a side surface of the first dummy post 111D. The second filling layer 230 may surround at least a portion of the first post 110 and at least a portion of the first dummy post 111D. The first lower post 111 and the first dummy post 111D may penetrate the second filling layer 230. At least a portion of the second filling layer 230 may be in direct contact with at least a portion of the first filling layer 130.

The third filling layer 330 may be disposed on the second active surface 220S1 of the second semiconductor chip 220, and may cover the third active surface 320S1 of the third semiconductor chip 320. The third filling layer 330 may surround a side surface of the third semiconductor chip 320. The third filling layer 330 may cover side surfaces of the third bump patterns 340. The third filling layer 330 may cover a side surface of the first intermediate post 112, a side surface of the second lower post 211, and a side surface of the second dummy post 112D. The first intermediate post 112, the second lower post 211, and the second dummy post 112D may penetrate the third filling layer 330. At least a portion of the third filling layer 330 may be in direct contact with at least a portion of the second filling layer 230.

The fourth filling layer 430 may be disposed on the third active surface 320S1 of the third semiconductor chip 320, and may cover the fourth active surface 420S1 of the fourth semiconductor chip 420. The fourth filling layer 430 may surround a side surface of the fourth semiconductor chip 420. The fourth filling layer 430 may cover side surfaces of the fourth bump patterns 440. The fourth filling layer 430 may cover a side surface of the first upper post 113, a side surface of the second upper post 212, a side surface of the third post 310, and a side surface of the third dummy post 113D. The first upper post 113, the second upper post 212, the third post 310, and the third dummy post 113D may penetrate the fourth filling layer 430. At least a portion of the fourth filling layer 430 may be in direct contact with at least a portion of the third filling layer 330.

The first to fourth filling layers 130, 230, 330, and 430 may include an insulating material. The insulating material may include a non-photosensitive insulating material including, for example, an inorganic filler and/or insulating resin. The non-photosensitive insulating material may include at least one of, for example, a thermosetting resin such as an epoxy resin, and a thermoplastic resin such as a polyimide resin. The non-photosensitive insulating material may be an ABF or an EMC, or may be a photoimageable encapsulant (PIE).

As described further below, the semiconductor package 100A may go through a grinding process, and in this case, surfaces of the second to fourth bump patterns 240, 340, and 440 connected to the first to third posts 110, 210, and 310, respectively, may be disposed on a level the same as a level of an upper surface of each of the second to fourth filling layers 230, 330, and 430. For example, a surface of the second bump 241 connected to the first post 110 may be disposed on a level the same as a level of an upper surface of the second filling layer 230, portions of which are in contact with the third filling layer 330. The term "same level" may include a fine difference caused by process errors.

Referring to FIG. 1, the semiconductor package 100A may further include adhesive layers 220A, 320A, and 420A for fastening the plurality of semiconductor chips 20.

A die attack film (DAF) may be used to implement the adhesive layers 220A, 320A, and 420A. The adhesive layers 220A, 320A, and 420A may be, for example, tape fastening the plurality of semiconductor chips 20. The tape used to implement the adhesive layers 220A, 320A, and 420A may be, for example, an epoxy composition. The plurality of semiconductor chips 20 may be stably fixed through the adhesive layers 220A, 320A, and 420A, and reliability may thus improve.

The adhesive layers 220A, 320A, and 420A may include a first adhesive layer 220A, a second adhesive layer 320A, and a third adhesive layer 420A.

In an exemplary embodiment, the first adhesive layer 220A may be disposed on a lower portion of the second inactive surface 220S2 of the second semiconductor chip 220. The first adhesive layer 220A may be in contact with the frame 101, the first filling layer 130, and the first dummy bump 141D.

In an exemplary embodiment, the second adhesive layer 320A may be disposed below the third inactive surface 320S2 of the third semiconductor chip 320. The second adhesive layer 320A may be in contact with the second filling layer 230 and the second dummy bump 241D.

In an exemplary embodiment, the third adhesive layer 420A may be disposed on a lower portion of the fourth inactive surface 420S2 of the fourth semiconductor chip 420. The third adhesive layer 420A may be in contact with the third filling layer 330 and the third dummy bump 341D.

Referring to FIG. 1, the semiconductor package 100A may further include an underbump metal layer 560 disposed on the connection member 550, a conductive pattern 570 disposed on the underbump metal layer 560, and a metal layer 105.

The conductive pattern 570 may physically and/or electrically connect the semiconductor package 100A to an external entity. For example, the semiconductor package 100A may be mounted on a mainboard of an electronic device through the conductive pattern 570. The conductive pattern 570 may be electrically connected to the redistribution layer 552 exposed through the underbump metal layer 560. The conductive pattern 570 may include tin (Sn) or an alloy including tin (Sn). The conductive pattern 570 may be formed of, for example, solder, but exemplary embodiments are not limited thereto.

The conductive pattern 570 may be configured as, for example, a land, a ball, a pin, etc. A plurality of the conductive patterns 570 or a single conductive pattern 570 may be provided. When a plurality of the conductive pattern 570 is provided, the conductive pattern 570 may include, for example, a copper pillar or solder. When a single conductive pattern 570 is provided, the conductive pattern 570 may include, for example, tin-silver solder or copper, but exemplary embodiments are not limited thereto.

The number of the conductive pattern 570, a gap between the conductive patterns 570, and a dispositional form of the conductive pattern 570 may be varied in exemplary embodiments.

Figure 2:
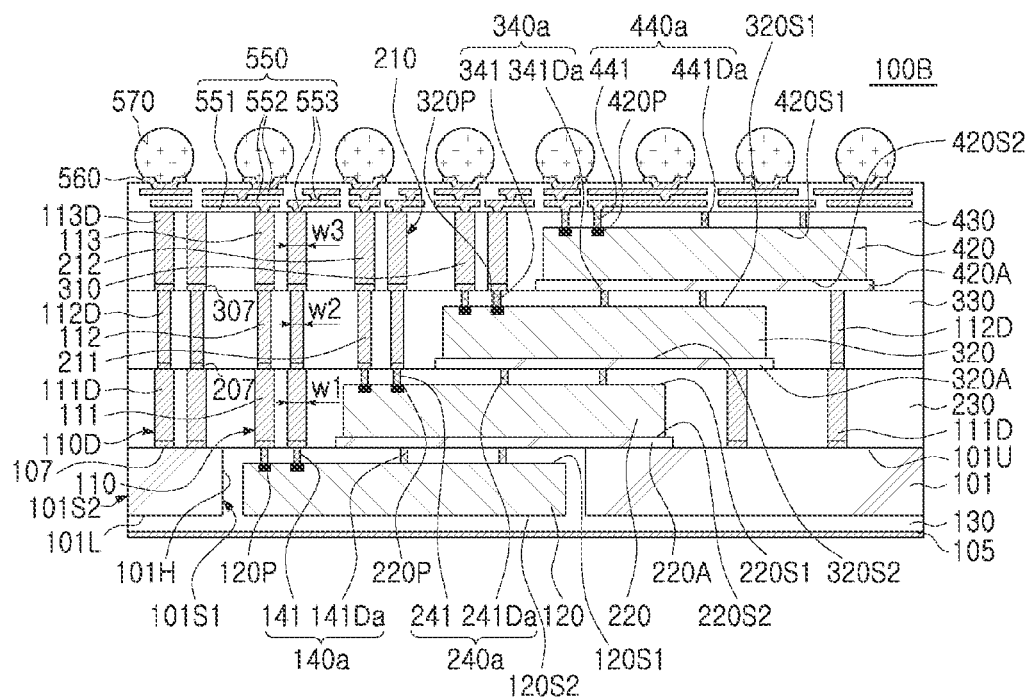
FIG. 2 is a cross-sectional diagram illustrating a semiconductor package according to an exemplary embodiment of the present inventive concept.

FIG. 2 is a cross-sectional diagram illustrating a semiconductor package according to an exemplary embodiment.

For convenience of explanation, a further description of elements and technical aspects previously described may be omitted.

Referring to FIG. 2, in a semiconductor package 100B, each of first to fourth dummy bumps 141Da, 241Da, 341Da, and 441Da may have a pillar shape, rather than a plate shape, unlike the semiconductor package 100A described with reference to FIG. 1.

The number of the first to fourth dummy bumps 141Da, 241Da, 341Da, and 441Da, a gap among the first to fourth dummy bumps 141Da, 241Da, 341Da, and 441Da, and a dispositional form of the first to fourth dummy bumps 141Da, 241Da, 341Da, and 441Da may be varied in exemplary embodiments. Each of the first to fourth dummy bumps 141Da, 241Da, 341Da, and 441Da may have a thickness and/or a height substantially the same as a thickness and/or a height of each of the first to fourth bumps 141, 241, 341, and 441.

The first to fourth dummy bumps 141Da, 241Da, 341Da, and 441Da may be included in first to fourth bump patterns 140a, 240a, 340a, and 440a along with the first to fourth bumps 141, 241, 341, and 441. The first bump patterns 140a may be disposed on a uniform level on a first active surface of a first semiconductor chip 120 and may maintain flatness of the semiconductor package 100B, and may improve heat dissipation properties. Each of the second to fourth bump patterns 240a, 340a, and 440a may have a structure similar to the above-described structure, and may provide the above-described effect.

Figure 3:
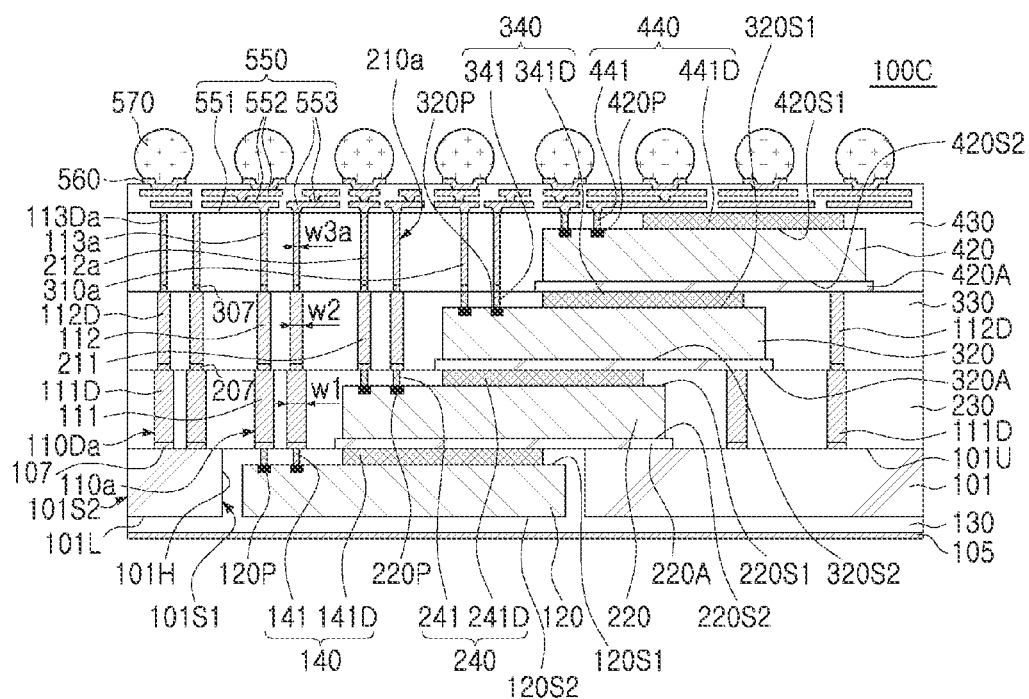
FIG. 3 is a cross-sectional diagram illustrating a semiconductor package according to an exemplary embodiment of the present inventive concept.

FIG. 3 is a cross-sectional diagram illustrating a semiconductor package according to an exemplary embodiment.

For convenience of explanation, a further description of elements and technical aspects previously described may be omitted.

Referring to FIG. 3, in a semiconductor package 100C, a width of an upper portion of each of first to third posts 110a, 210a, and 310a and a width of an upper portion of a dummy post 110Da may be different from those of the first semiconductor package 100A described above. For example, the first post 110a may include a first lower post 111 having a first width w1, a first intermediate post 112 having a second width w2 smaller than the first width w1, and a first upper post 113a having a third width w3a smaller than the second width w2. The above-described exemplary embodiment may also be applied to a second upper post 212a of the second post 210a, and the third post 310a.

A dummy post 110Da may include a first dummy post 111D having the first width w1, a second dummy post 112D having the second width w2 smaller than the first width w1, and a third dummy post 113Da having the third width w3a smaller than the second width w2. By configuring a width of each of the first to third posts 110a, 210a, and 310a and a width of the dummy post 110Da differently, an alignment margin between the post may improve.

Figure 4:
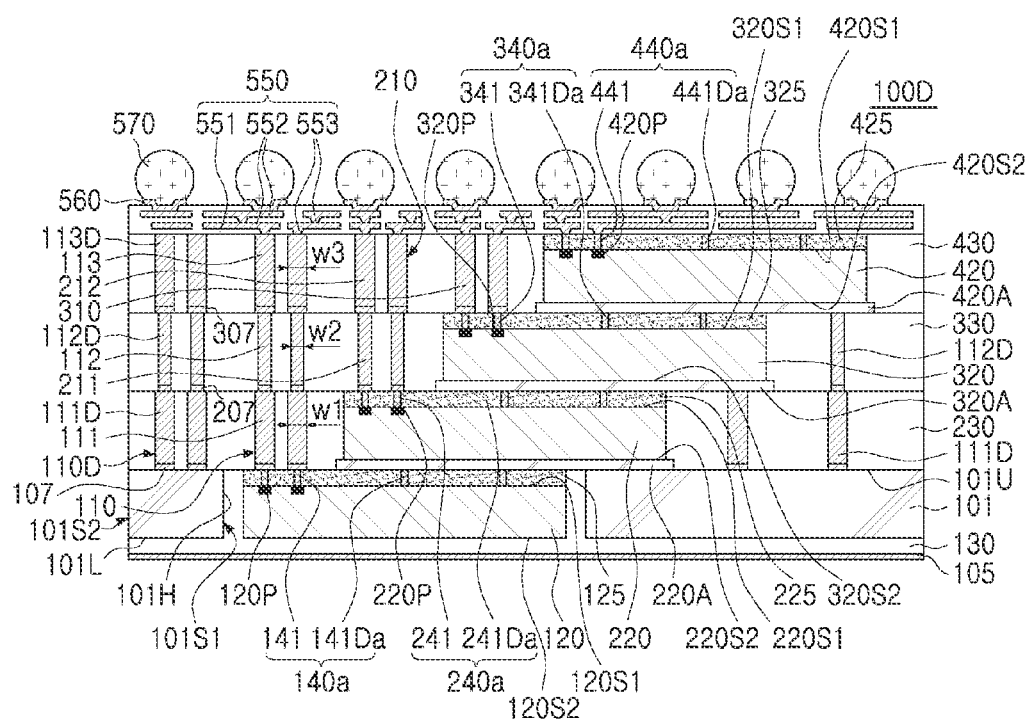
FIG. 4 is a cross-sectional diagram illustrating a semiconductor package according to an exemplary embodiment of the present inventive concept.

FIG. 4 is a cross-sectional diagram illustrating a semiconductor package according to an exemplary embodiment.

For convenience of explanation, a further description of elements and technical aspects previously described may be omitted.

Referring to FIG. 4, a semiconductor package 100D may further include first to fourth insulating layers 125, 225, 325, and 425 disposed on first to fourth active surfaces of first to fourth semiconductor chips 120, 220, 320, and 420, respectively, unlike the semiconductor package 100B described with reference to FIG. 2.

The first insulating layer 125 may cover side surfaces of first bump patterns 140a on the first active surface. Thus, in an exemplary embodiment, the first insulating layer 125 may cover side surfaces of the first bump 141 and the first dummy bump 141D on the first active surface 120S1 of the first semiconductor chip 120. The first bump patterns 140a may penetrate the first insulating layer 125. Side surfaces of the first insulating layer 125 may be covered by a first filling layer 130.

The description of the second to fourth insulating layers 225, 325, and 425 may be similar to the description of the first insulating layer 125 described above, and thus, a repetitive detailed description thereof will be omitted.

The first to fourth insulating layers 125, 225, 325, and 425 may include an insulating material. For example, the insulating material may be a photosensitive insulating material such as PID resin.

The first to fourth insulating layers 125, 225, 325, and 425 may improve stiffness of the semiconductor package 100D to improve flatness thereof. Also, the first to fourth insulating layers 125, 225, 325, and 425 may work as support members such that the first to fourth bump patterns 140a, 240a, 340a, and 440a may maintain shapes thereof.

Figure 5:
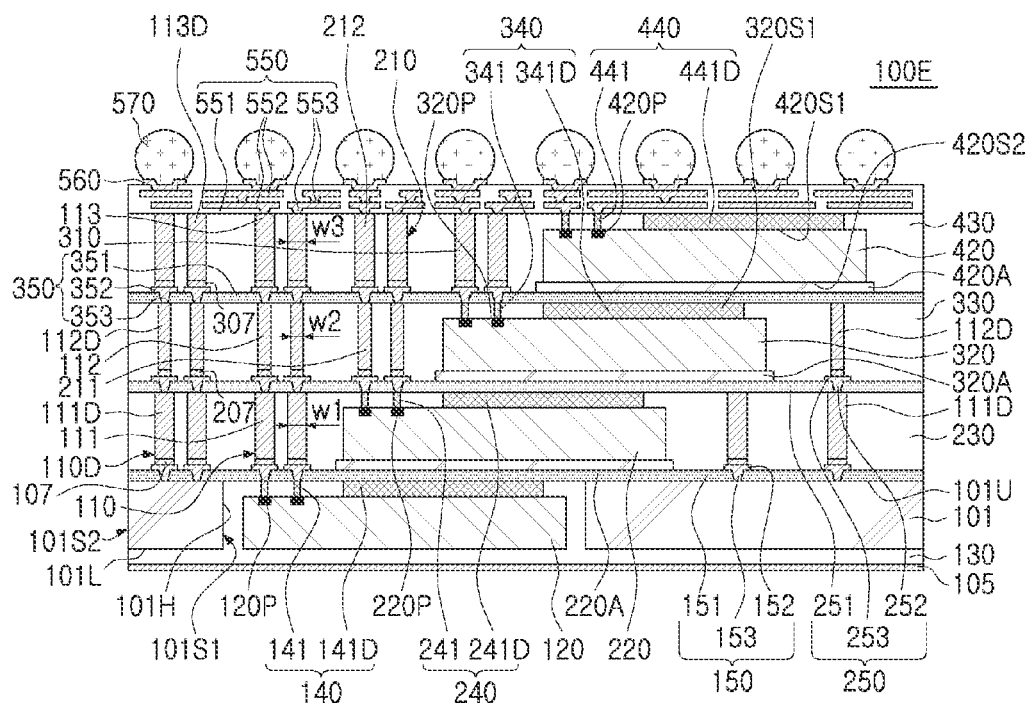
FIG. 5 is a cross-sectional diagram illustrating a semiconductor package according to an exemplary embodiment of the present inventive concept.

FIG. 5 is a cross-sectional diagram illustrating a semiconductor package according to an exemplary embodiment.

For convenience of explanation, a further description of elements and technical aspects previously described may be omitted.

Referring to FIG. 5, a semiconductor package 100E may further include a first connection member 150 disposed between first and second filling layers 130 and 230, a second connection member 250 disposed between second and third filling layers 230 and 330, and a third connection member 350 disposed between third and fourth filling layers 330 and 430, unlike the semiconductor package 100A described with reference to FIG. 1.

The first connection member 150 may include a first interlayer insulating layer 151, a first wiring layer 152 disposed on the first interlayer insulating layer 151, and a first connection via 153 penetrating the first interlayer insulating layer 151 and electrically connected to the first wiring layer 152. A portion of the first wiring layer 152 may be electrically connected to a first bump 141 through the first connection via 153. A first lower post 111 may be disposed on the first wiring layer 152, and may be electrically connected to a first connection pad 120P through the first wiring layer 152. A first dummy post 111D may also be disposed on the first wiring layer 152.

The second connection member 250 may include a second interlayer insulating layer 251, a second wiring layer 252 disposed on the second interlayer insulating layer 251, and a second connection via 253 penetrating the second interlayer insulating layer 251 and electrically connected to the second wiring layer 252. A portion of the second wiring layer 252 may be electrically connected to a second bump 241 through the second connection via 253. A second lower post 211 may be disposed on the second wiring layer 252, and may be electrically connected to a second connection pad 220P through the second wiring layer 252. The first intermediate post 112 may be disposed on the second wiring layer 252, and may be electrically connected to the first lower post 111 through the second wiring layer 252. A second dummy post 112D may also be disposed on the second wiring layer 252.

The third connection member 350 may include a third interlayer insulating layer 351, a third wiring layer 352 disposed on the third interlayer insulating layer 351, and a third connection via 353 penetrating the third interlayer insulating layer 351 and electrically connected to the third wiring layer 352. A portion of the third wiring layer 352 may be electrically connected to a third bump 341 through the third connection via 353. A third post 310 may be disposed on the third wiring layer 352, and may be electrically connected to a third connection pad 320P through the third wiring layer 352. A second upper post 212 may be disposed on the third wiring layer 352, and may be electrically connected to the second lower post 211 through the third wiring layer 352. A first upper post 113 may be disposed on the third wiring layer 352, and may be electrically connected to the second lower post 211 through the third wiring layer 352. A third dummy post 113D may also be disposed on the third wiring layer 352.

Since the semiconductor package 100E further includes the first connection member 150 including the first wiring layer 152, the second connection member 250 including the second wiring layer 252, and the third connection member 350 including the third wiring layer 352, a process margin of the post disposed on each layer may improve, and the first to third interlayer insulating layers 151, 251, and 351 may be disposed to be flat such that flatness of the semiconductor package 100E may improve.

Figure 6:
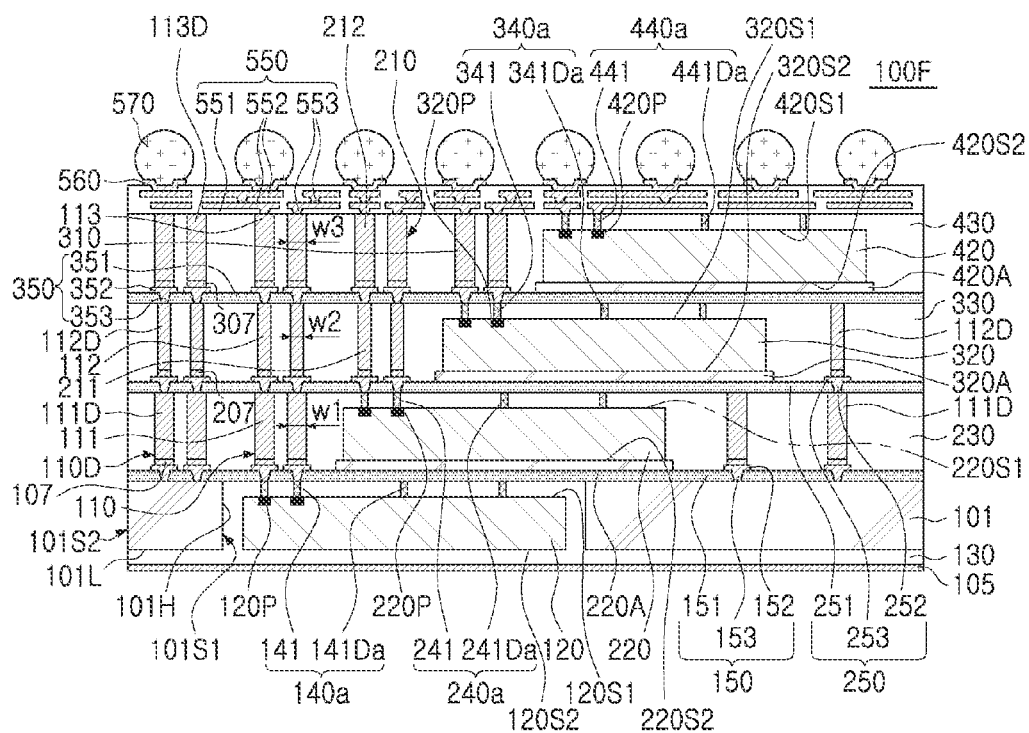
FIG. 6 is a cross-sectional diagram illustrating a semiconductor package according to an exemplary embodiment of the present inventive concept.

FIG. 6 is a cross-sectional diagram illustrating a semiconductor package according to an exemplary embodiment.

For convenience of explanation, a further description of elements and technical aspects previously described may be omitted.

Referring to FIG. 6, in a semiconductor package 100F, each of first to fourth dummy bumps 141Da, 241Da, 341Da, and 441Da may have a plate shape, rather than a pillar shape, unlike the semiconductor package 100E described with reference to FIG. 5. The description of the configuration is substantially the same as the description of the semiconductor package 100E, and thus, a repetitive description thereof is omitted.

Figure 7:
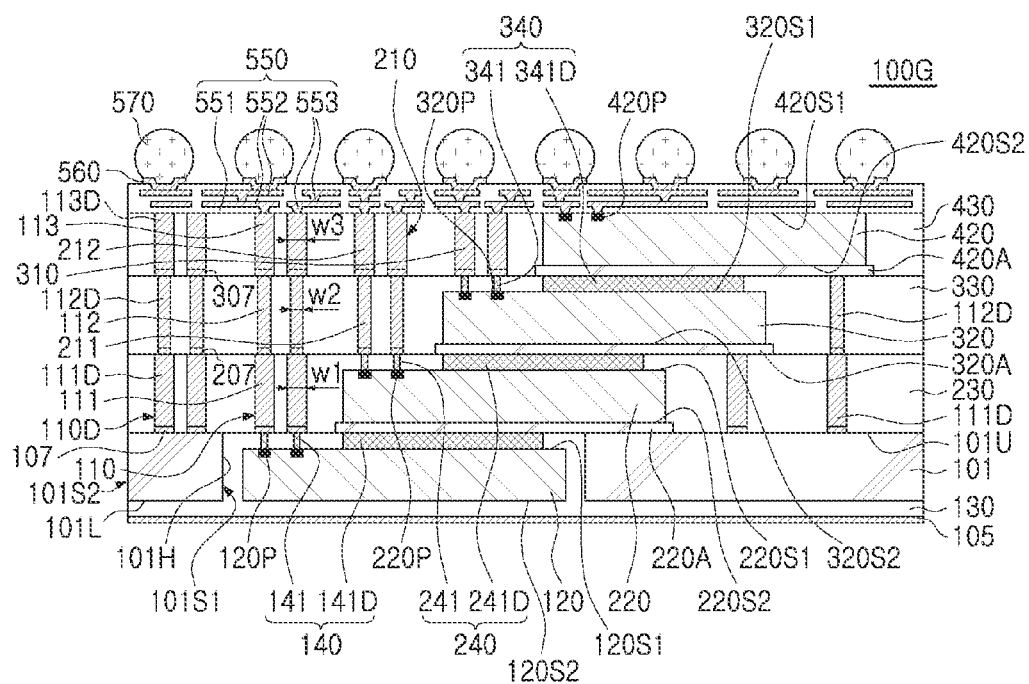
FIG. 7 is a cross-sectional diagram illustrating a semiconductor package according to an exemplary embodiment of the present inventive concept.

FIG. 7 is a cross-sectional diagram illustrating a semiconductor package according to an exemplary embodiment.

For convenience of explanation, a further description of elements and technical aspects previously described may be omitted.

Referring to FIG. 7, in an exemplary embodiment, a semiconductor package 100G does not include the fourth bump patterns 440, unlike the semiconductor package 100A described with reference to FIG. 1. Accordingly, a second connection pad 420P of a fourth semiconductor chip 420 may be in direct contact with a redistribution via 553 of a connection member 550 and may be electrically connected to a redistribution layer 552. Since a process for forming the fourth bump patterns 440 is not performed, process costs may be reduced, and an electrical connection path between the fourth connection pad 420P of the fourth semiconductor chip 420 and the redistribution layer 552 may be reduced.

Figure 8:
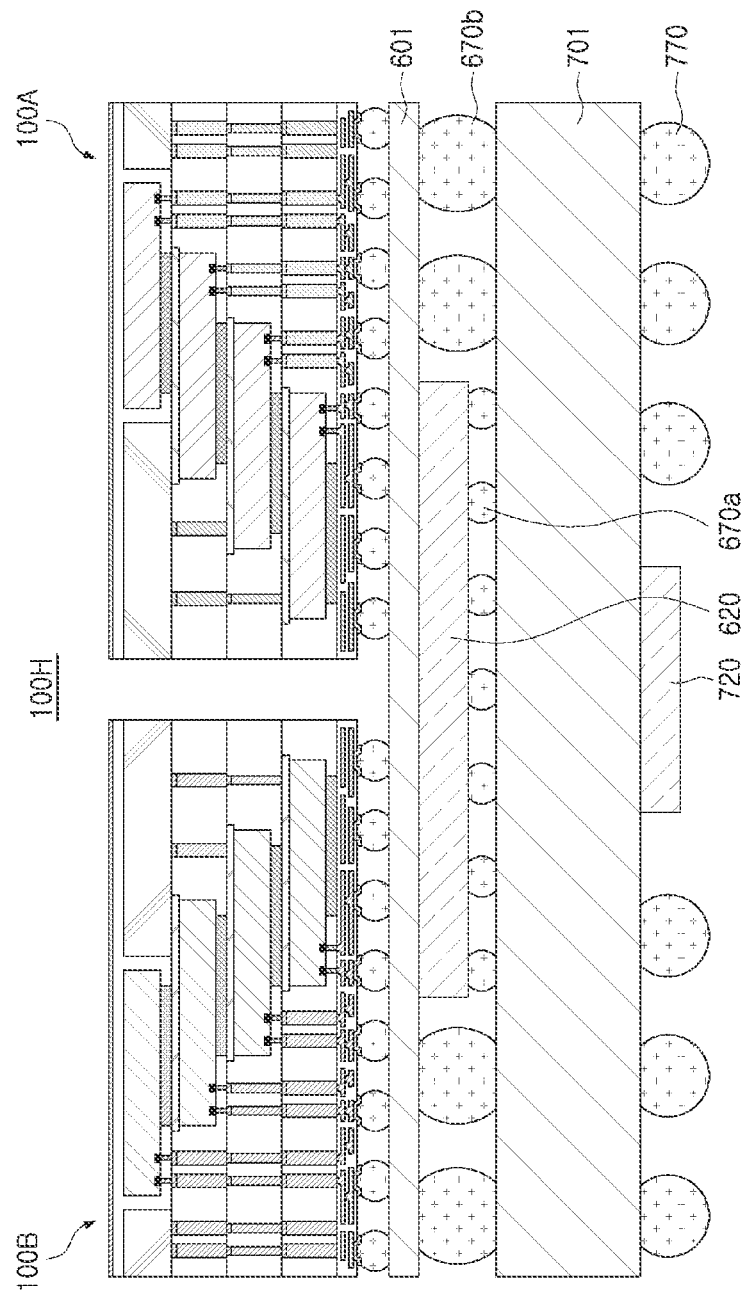
FIG. 8 is a cross-sectional diagram illustrating a semiconductor package according to an exemplary embodiment of the present inventive concept.

FIG. 8 is a cross-sectional diagram illustrating a semiconductor package according to an exemplary embodiment.

Referring to FIG. 8, a semiconductor package 100H may further include a substrate 701, a lower semiconductor chip 620 disposed on the substrate 701, an interposer substrate 601 disposed on the lower semiconductor chip 620, and a passive component 720.

In an exemplary embodiment, the semiconductor package 100A may be disposed such that the conductive pattern 570 of the semiconductor package 100A may be in contact with a first surface of the interposer substrate 601. The conductive pattern 570 may be electrically connected to the interposer substrate 601 on the interposer substrate 601. For example, four semiconductor packages 100A may be disposed on a level the same as a level of the first surface on the interposer substrate 601. The first to fourth connection pads 120P, 220P, 320P, and 420P, which may function as input and output (I/O) terminals, may be redistributed again through the interposer substrate 601. The conductive pattern 570 may be fastened by, for example, an underfill resin, etc.

A lower semiconductor chip 620 may be disposed on a second surface of the interposer substrate 601 opposing the first surface of the interposer substrate 601. The lower semiconductor chip 620 may include an integrated circuit (IC). The integrated circuit may include a processor chip such as, for example, a central processor (e.g., a CPU), a graphics processor (e.g., a GPU), a field programmable gate array (FPGA), a digital signal processor, a cryptographic processor, a microprocessor, a microcontroller, etc.

The lower semiconductor chip 620 may be implemented as an application processor (AP), but exemplary embodiments are not limited thereto. The lower semiconductor chip 620 may be implemented as a memory chip such as, for example, a volatile memory (e.g., a DRAM), a non-volatile memory (e.g., a ROM), a flash memory, etc., a logic chip such as an analog-digital converter, an application-specific IC (ASIC), or different types of chips such as a power management IC (PMIC), or may be implemented by a combination thereof.

The lower semiconductor chip 620 may be in contact with the substrate 701 through a first conductive pattern 670a, and the interposer substrate 601 may be in contact with the substrate 701 through a second conductive pattern 670b.

The passive component 720 may be disposed on a lower surface of the substrate 701, and may be disposed between third conductive patterns 770. The passive component 720 may be configured as a chip-type capacitor such as an MLCC or an LICC, or a chip-type inductor such as a power inductor. The number of the passive component 720 is not limited to any particular example, and in exemplary embodiments, the number of the passive component 720 may be greater than that shown in FIG. 8.

FIGS. 9 to 16 are cross-sectional diagrams illustrating a method of manufacturing a semiconductor package (e.g., the semiconductor packet according to an exemplary embodiment. FIGS. 9 to 16 illustrate cross-sectional surfaces corresponding to FIG. 1.

Figure 9:
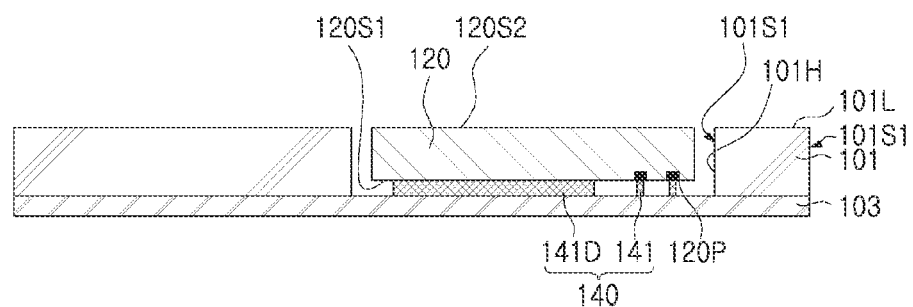
FIGS. 9 to 16 are cross-sectional diagrams illustrating a method of manufacturing a semiconductor package according to an exemplary embodiment of the present inventive concept.

Referring to FIG. 9, a frame 101 having a through-opening 101H may be disposed on an adhesive film 103. A first semiconductor chip 120 having a first active surface 120S1 on which a first connection pad 120P is disposed may be disposed in the through-opening 101H.

The adhesive film 103 may be a tape for fastening the frame 101. For example, the adhesive film 103 may include a heat treatment curable adhesive tape, the adhesive force of which may be attenuated by heat treatment, or an infrared curable adhesive tape, the adhesive force of which may be attenuated by irradiating infrared rays.

The frame 101 may have a first side surface 101S1 exposed through the through-opening 101H. The first side surface 101S1 may face the first semiconductor chip 120. The frame 101 may include an insulating material as described above with reference to FIG. 1.

The first semiconductor chip 120 may be disposed such that the first active surface 120S1 may face the adhesive film 103 in the through-opening 101H of the frame 101. First bump patterns 140 may be disposed on the first active surface 120S1 of the first semiconductor chip 120. The first bump patterns 140 may include a first bump 141 connected to the first connection pad 120P on the first connection pad 120P and a first dummy bump 141D which is not connected to the first connection pad 120P.

Figure 10:
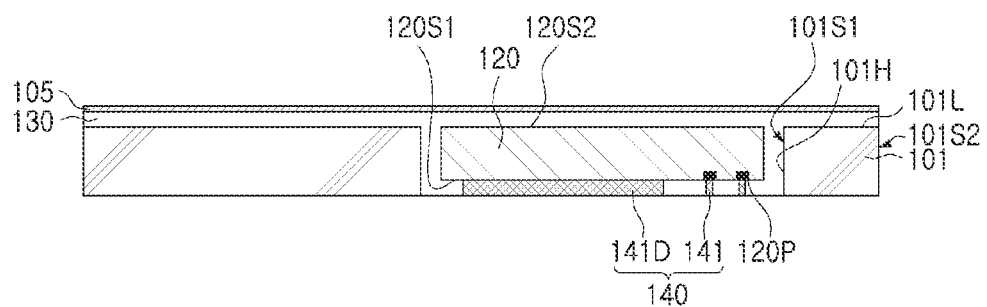

Referring to FIG. 10, a first filling layer 130 filling a space between the through-opening 101H of the frame 101 and the first semiconductor chip 120 may be disposed.

The first filling layer 130 may fill a space between the first side surface 101S1 of the frame 101 and a side surface of the first semiconductor chip 120 in the through-opening 101H of the frame 101. The first filling layer 130 may cover the first active surface 120S1 and the first inactive surface 120S2 of the first semiconductor chip 120. The first filling layer 130 may extend to cover one surface of the frame 101 (e.g., the lower surface 101L).

In an exemplary embodiment, forming the first filling layer 130 may include laminating and curing a precursor used for forming the first filling layer 130. In an exemplary embodiment, the first filling layer 130 may be formed by applying the first filling layer 130 to seal the first semiconductor chip 120 and curing the first filling layer 130. By performing the curing process, the first semiconductor chip 120 may be fastened.

A metal layer 105 may be formed. The metal layer 105 may be disposed on the first filling layer 130. In exemplary embodiments, the thickness of the metal layer 105 may vary (e.g., the thickness may be greater than the thickness shown in FIGS. 10 to 16), or the metal layer 105 is not provided.

The metal layer 105 control warpage. The metal layer 105 may emit heat generated from the plurality of semiconductor chips 20 (see FIG. 1).

The adhesive film 103 (see FIG. 9) may be removed. By removing the adhesive film 103, an upper surface 101U of the frame 101 may be exposed. In an exemplary embodiment, the adhesive film 103 may be removed after the metal layer 105 is formed, but exemplary embodiments are not limited thereto. For example, in an exemplary embodiment, the adhesive film 103 may be removed before the metal layer 105 is formed.

In an exemplary embodiment, removing the adhesive film 103 may be performed after attenuating adhesive force of the adhesive film 103 by performing heat treatment when the adhesive film 103 includes a heat treatment curable adhesive tape of which adhesive force may be attenuated by heat treatment.

In an exemplary embodiment, removing the adhesive film 103 may be performed after attenuating adhesive force of the adhesive film 103 by irradiating infrared rays to the adhesive film 103 when the adhesive film 103 includes an infrared curable adhesive tape of which adhesive force may be attenuated by irradiating infrared rays.

Figure 11:
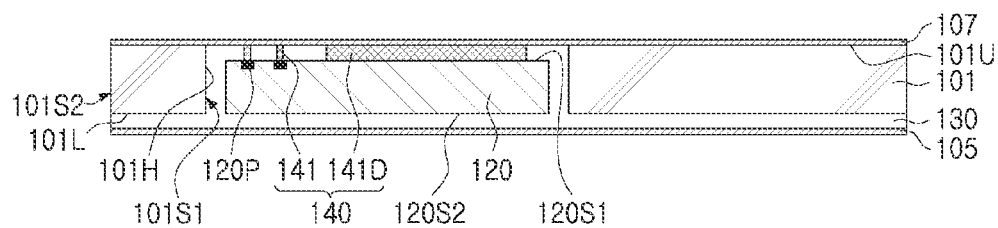

Referring to FIG. 11, a metal seed layer 107 covering the upper surface 101U of the frame 101 may be disposed.

The metal seed layer 107 may extend to cover the upper surface 101U of the frame 101, a portion of the first filling layer 130, an upper surface of the first bump 141, and an upper surface of the first dummy bump 141D. The metal seed layer 107 may be formed by an electrolytic plating method or an electroless plating method.

In an exemplary embodiment, forming the metal seed layer 107 is not performed.

Figure 12:
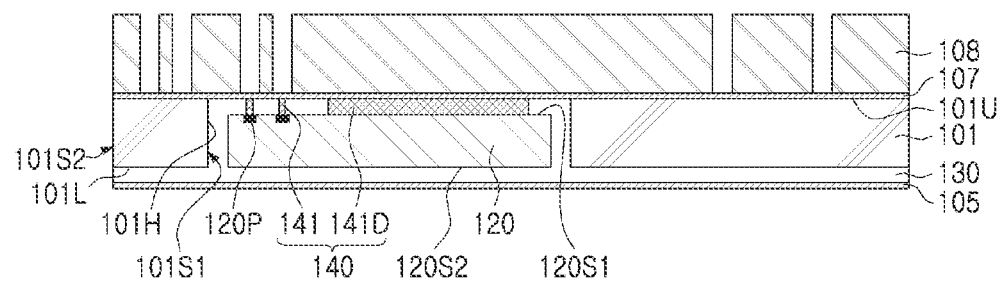

Referring to FIG. 12, a mask layer 108 covering the metal seed layer 107 may be formed, and a via hole may be formed by partially removing the mask layer 108 to expose a portion of an upper surface of the metal seed layer 107.

The mask layer 108 may be formed by a method of laminating and curing a precursor, or a method of applying and curing a precursor material. The via hole may be formed in the mask layer 108 using, for example, a photolithography method, a mechanical drill, and/or a laser drill. The mask layer 108 may include an insulating material such as, for example, a photoimageable dielectric (PID). As a result of forming the via hole, a portion of an upper surface of the metal seed layer 107 may be exposed.

Figure 13:
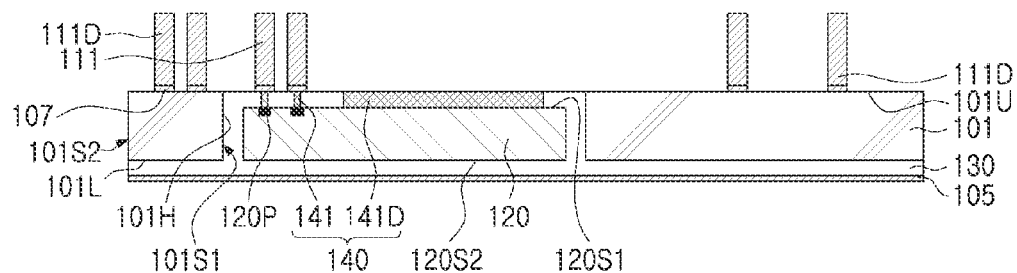

Referring to FIG. 13, a first lower post 111 and a first dummy post 111D filling the via hole may be formed, and the mask layer 108 and a portion of the metal seed layer 107 to which an upper surface is not exposed may be removed together.

In an exemplary embodiment, the first lower post 111 and the first dummy post 111D may be formed by a plating process. The plating process may be, for example, an electrolytic plating process or an electroless plating process.

In an exemplary embodiment, the first lower post 111 and the first dummy post 111D may be formed using, for example, a subtractive process, an additive process, a semi-additive process, and a modified semi-additive process (MSAP).

In an exemplary embodiment, the first lower post 111 and the first dummy post 111D may be formed using, for example, a chemical vapor deposition (CVD) process or a physical vapor deposition (PVD) process.

After partially removing the metal seed layer 107, the metal seed layer 107 may remain in a lower portion of each of the first lower post 111 and the first dummy post 111D.

In an exemplary embodiment, the metal seed layer 107 is not provided. In this case, each of the first lower post 111 and the first dummy post 111D may be in direct contact with the upper surface 101U of the frame 101.

Figure 14:
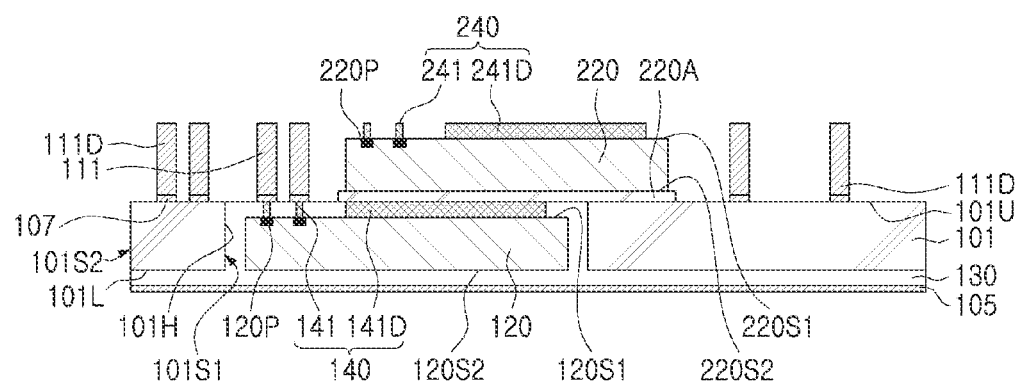

Referring to FIG. 14, a second semiconductor chip 220 which may have a second inactive surface 220S2 to which an adhesive layer 220A is attached and a second active surface 220S1 on which a second connection pad 220P is disposed may be disposed on the first semiconductor chip 120.

The second semiconductor chip 220 may be offset with the first semiconductor chip 120.

Disposing the second semiconductor chip 220 may include disposing the second semiconductor chip 220 on the first semiconductor chip 120 while second bump patterns 240 are formed on the second active surface 220S1 of the second semiconductor chip 220. The second bump patterns 240 may include a second bump 241 connected to the second connection pad 220P on the second connection pad 220P and a second dummy bump 241D which is not connected to the second connection pad 220P.

Figure 15:
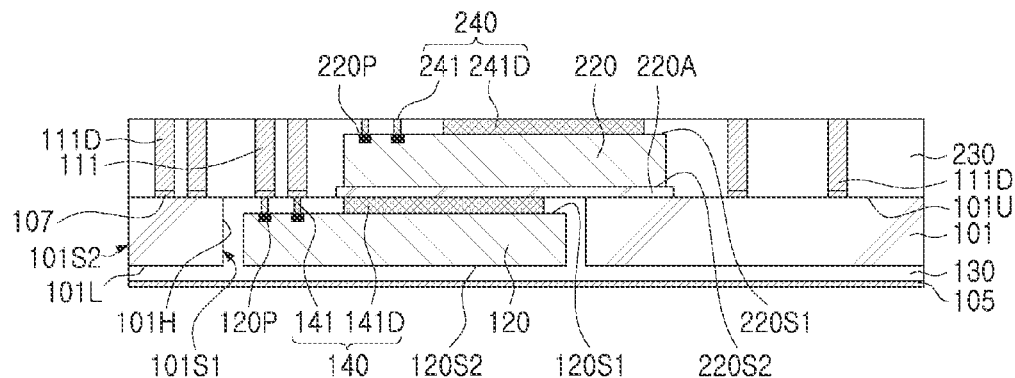

Referring to FIG. 15, a second filling layer 230 covering the second semiconductor chip 220 may be disposed.

The second filling layer 230 may cover the second active surface 220S1 of the second semiconductor chip 220. The second filling layer 230 may cover side surfaces of the second bump patterns 240. The second filling layer 230 may cover side surfaces of each of the first lower post 111, the first dummy post 111D, and the second bump patterns 240.

In an exemplary embodiment, forming the second filling layer 230 may include laminating and curing a precursor used for forming the second filling layer 230. In an exemplary embodiment, the second filling layer 230 may be applied and cured to seal the second semiconductor chip 220. By performing the curing process, the second semiconductor chip 220 may be fastened.

The second filling layer 230 may be planarized until the second bump patterns 240, the first lower post 111, and the first dummy post 111D are exposed.

Planarizing the second filling layer 230 may including performing a grinding process. In this process, upper surfaces of the second bump patterns 240, the first lower post 111, and the first dummy post 111D may be substantially coplanar with one another. For example, upper surfaces of the second bump patterns 240, the first lower post 111, and the first dummy post 111D may be substantially aligned with one another.

Figure 16:
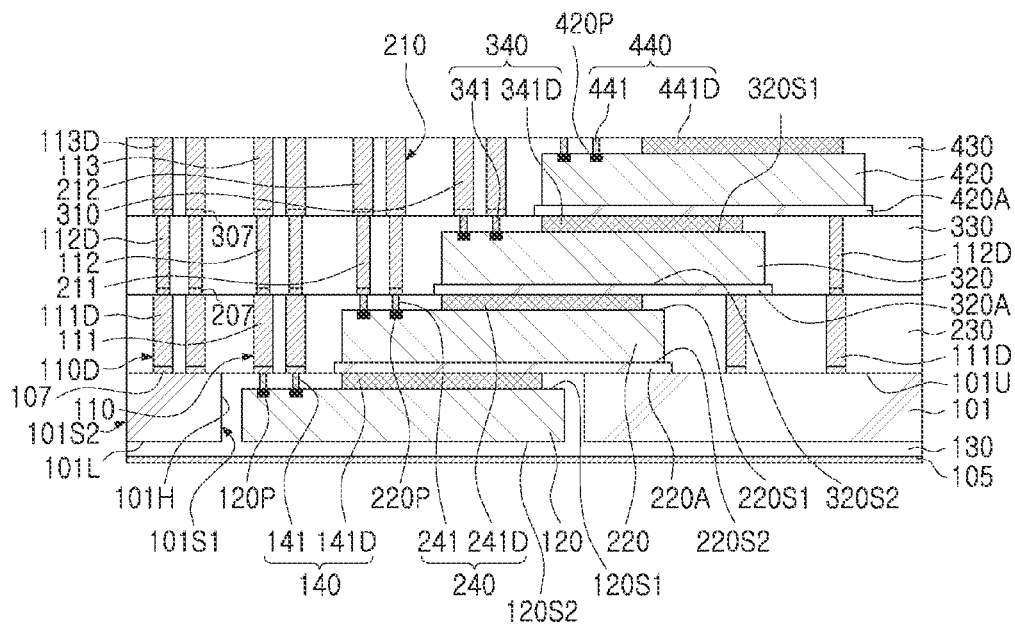

Referring to FIG. 16, the method described with reference to FIGS. 11 to 15 may be performed repeatedly such that a third semiconductor chip 320, a fourth semiconductor chip 420, third bump patterns 340, fourth bump patterns 440, a first post 110, a second post 210, a third post 310, a dummy post 110D, a third filling layer 330, and a fourth filling layer 430 are formed.

In an exemplary embodiment, forming the first to third posts 110, 210, and 310 and the dummy post 110D may include forming a plurality of posts having different widths, which may improve an alignment margin. For example, forming the first post 110 may include forming a first intermediate post 112 having a width less than a width of the first lower post 111 on the first lower post 111, and forming the first upper post 113 having a width greater than a width of the first intermediate post 112 on the first intermediate post 112. The process may also be applied to the dummy post 110D.

Referring back to FIG. 1, a connection member 550 may be disposed on the fourth filling layer 430, and an underbump metal layer 560 and a conductive pattern 570 may be disposed on the connection member 550.

In an exemplary embodiment, the connection member 550 may be formed by a method of forming an insulating layer 551 using a lamination process or a coating process, forming a via hole in the insulating layer 551, and forming a redistribution layer 552 and a redistribution via 553 through an electrolytic plating process or an electroless plating process. When a PID is used as the insulating layer, the via hole may be formed as a fine pitch using a photolithography method. An opening may be formed in the insulating layer 551, an underbump metal layer 560 may be disposed in the opening, and a conductive pattern 570 may be formed on and electrically connected to the underbump metal layer 560. The underbump metal layer 560 may be electrically connected to the redistribution layer 552. Accordingly, the semiconductor package 100A illustrated in FIG. 1 may be manufactured.

In an exemplary embodiment, the connection member 550 may be disposed on an uppermost portion of the plurality of stacked semiconductor chips 20. Differently from the exemplary embodiment illustrated in the diagram, when the plurality of semiconductor chips 20 include only the first and second semiconductor chips 120 and 220, the connection member 550 may be disposed on the second filling layer 230 and may redistribute the first and second connection pads 120P and 220P of the first and second semiconductor chips 120 and 220.

According to the aforementioned exemplary embodiments, a semiconductor package having improved package performance and an appropriate package size may be provided.

In exemplary embodiments, a lower portion, a lower surface, etc. may indicate a downward direction with reference to a cross-sectional surface in the drawings, and an upper portion, an upper surface, etc., may indicate opposite directions for ease of description, unless otherwise indicated.

In exemplary embodiments, the term "being connected" may include "being directly connected," and also "being indirectly connected" through an adhesive layer. Also, the term "being electrically connected" may include "being physically connected" and "not being physically connected." The terms including ordinal number such as "first," "second," etc. may be used in the description and the claims to distinguish the elements from one another. These terms are used only for the purpose of differentiating one component from another, without limitation thereto. For example, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Herein, when elements are described as being substantially coplanar with one another, it is to be understood that elements are exactly coplanar with one another, or almost coplanar with one another (e.g., within a measurement error), as would be understood by a person having ordinary skill in the art. Further, when one value is described as being about the same as or about equal to another value, it is to be understood that the values are equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
   a plurality of semiconductor chips comprising a first semiconductor chip having a first active surface on which first connection pads are disposed and a first inactive surface opposing the first active surface, and a second semiconductor chip disposed on the first semiconductor chip and having a second active surface on which second connection pads are disposed and a second inactive surface opposing the second active surface,
   a first adhesive layer disposed below the second inactive surface of the second semiconductor chip;
   first bumps disposed directly on the first connection pads;
   second bumps disposed directly on the second connection pads;
   at least one first dummy bump directly on the first active surface of the first semiconductor chip and spaced apart from the first bumps;
   a first filling layer covering the first active surface of the first semiconductor chip, side surfaces of the first bumps, and side surfaces of the at least one first dummy bump; and
   at least one second dummy bump directly on the second active surface of the second semiconductor chip and spaced apart from the second bumps,
   wherein the first bump does not overlap the second semiconductor chip in a vertical direction perpendicular to an upper surface of the first semiconductor chip, and
   wherein the first adhesive layer is in contact with the second semiconductor chip, the first filling layer, and the at least one first dummy bump.

2. The semiconductor package of claim 1, wherein an upper surface of the at least one first dummy bump is substantially coplanar with upper surfaces of the first bumps.

3. The semiconductor package of claim 1, wherein the at least one first dummy bump overlaps the second semiconductor chip in a vertical direction perpendicular to an upper surface of the first semiconductor chip.

4. The semiconductor package of claim 1, wherein a width of the at least one first dummy bump is greater than a width of one of the first bumps.

5. The semiconductor package of claim 1, wherein the at least one first dummy bump includes a plurality of first dummy bumps spaced apart from each other.

6. The semiconductor package of claim 1, wherein the first adhesive layer is spaced apart from the first bump.

7. The semiconductor package of claim 1, further comprising:
   a second filling layer covering the second active surface of the semiconductor chip, side surfaces of the second bumps, and side surfaces of the at least one second dummy bump.

8. The semiconductor package of claim 1, further comprising:
   a first insulating layer covering side surfaces of the first bump and the at least on first dummy bump on the first active surface of the first semiconductor chip; and
   a first filling layer covering side surfaces of the first insulating layer and side surfaces of the first semiconductor chip.

9. The semiconductor package of claim 1, further comprising:
   a connection member disposed between the first semiconductor chip and the second semiconductor chip, the connection member comprising redistribution layers electrically connected to the first bumps.

10. A semiconductor package, comprising:
    a plurality of semiconductor chips comprising a first semiconductor chip having a first active surface on which first connection pads are disposed and a first inactive surface opposing the first active surface, and a second semiconductor chip disposed on the first semiconductor chip and having a second active surface on which second connection pads are disposed and a second inactive surface opposing the second active surface;
    a support member having a side surface facing a side surface of the first semiconductor chip;
    first bumps disposed directly on the first connection pads;
    first posts disposed directly on the first bumps and electrically connected to the first connection pads;
    first dummy posts disposed side by side with the first posts and overlapping the support member in a vertical direction perpendicular to an upper surface of the first semiconductor chip; and
    a connection member on the plurality of semiconductor chips and comprising redistribution layers electrically connected to each of the first and second posts.

11. The semiconductor package of claim 10, wherein upper surfaces of the first posts are substantially coplanar with upper surfaces of the first dummy posts.

12. The semiconductor package of claim 10, further comprising:

a first filling layer covering the first active surface of the first semiconductor chip and side surfaces of the first bumps; and a second filling layer covering the second active surface of the semiconductor chip, side surfaces of the first posts, and side surfaces of the first dummy posts.

13. The semiconductor package of claim 10, further comprising:

second posts disposed on the first posts, one of the second posts having a width different from a width of one of the first posts.

14. The semiconductor package of claim 10, further comprising:

second bumps disposed directly on the second connection pads;

second posts disposed directly on the second bumps and electrically connected to the second connection pads; and second dummy posts disposed side by side with the second posts and not overlapping the semiconductor chip in the vertical direction.

15. The semiconductor package of claim 10, wherein the support member includes a plurality of insulating layers, a plurality of wiring layers buried in the insulating layers, and a plurality of vias electrically connecting the plurality of wiring layers to one another.

16. A semiconductor package, comprising:

a plurality of semiconductor chips;

a plurality of filling layers surrounding side surfaces of the plurality of semiconductor chips, respectively;

a connection member disposed on the plurality of filling layers;

a plurality of posts disposed in the plurality of filling layers; and a plurality of bumps electrically connected to the plurality of semiconductor chips, respectively, wherein the plurality of semiconductor chips comprises a first semiconductor chip and a second semiconductor chip partially overlapping the first semiconductor chip, wherein the plurality of filling layers comprises a first filling layer surrounding a side surface of the first semiconductor chip and a second filling layer surrounding a side surface of the second semiconductor chip, wherein the plurality of bumps comprises a first bump electrically connected to a first connection pad of the first semiconductor chip, and a second bump electrically connected to a second connection pad of the second semiconductor chip, and wherein the plurality of posts comprises a first post penetrating the second filling layer on the first filling layer and electrically connected to the first bump, and a plurality of dummy posts penetrating the second filling layer.

17. The semiconductor package of claim 16, wherein the plurality of semiconductor chips further comprises a third semiconductor chip disposed on the second semiconductor chip, and a fourth semiconductor chip disposed on the third semiconductor chip, wherein the plurality of filling layers further comprises a third filling layer surrounding a side surface of the third semiconductor chip, and a fourth filling layer surrounding a side surface of the fourth semiconductor chip, wherein the plurality of bumps further comprises a third bump electrically connected to a third connection pad of the third semiconductor chip, and a fourth bump electrically connected to a fourth connection pad of the fourth semiconductor chip, and wherein the plurality of posts further comprises a second post penetrating the third filling layer on the second filling layer and electrically connected to the second bump, and a third post penetrating the fourth filling layer on the third filling layer and electrically connected to the third bump.

* * * * *